(12) United States Patent
Jeong et al.

(10) Patent No.: US 9,459,381 B2
(45) Date of Patent: Oct. 4, 2016

(54) BATCH FABRICATION METHOD OF THREE-DIMENSIONAL PHOTONIC MICROSTRUCTURES

(71) Applicant: KOREA ADVANCED INSTITUTE OF SCIENCE AND TECHNOLOGY, Daejeon (KR)

(72) Inventors: Ki-Hun Jeong, Daejeon (KR); Jae-Jun Kim, Daegu (KR); Dongmin Keum, Daegu (KR)

(73) Assignee: KOREA ADVANCED INSTITUTE OF SCIENCE AND TECHNOLOGY (KR)

( * ) Notice: Subject to any disclaimer, the term of this patent is extended or adjusted under 35 U.S.C. 154(b) by 0 days.

(21) Appl. No.: 14/635,186

(22) Filed: Mar. 2, 2015

(65) Prior Publication Data
US 2015/0247954 A1    Sep. 3, 2015

(30) Foreign Application Priority Data
Mar. 3, 2014   (KR) ........................ 10-2014-0024849

(51) Int. Cl.
| | |
|---|---|
| *B29D 11/00* | (2006.01) |
| *G02B 3/00* | (2006.01) |
| *G02B 1/00* | (2006.01) |
| *G02B 1/12* | (2006.01) |
| *B81C 99/00* | (2010.01) |
| *B82Y 20/00* | (2011.01) |
| *B82Y 30/00* | (2011.01) |
| *B82Y 40/00* | (2011.01) |
| *G02B 1/04* | (2006.01) |
| *G02B 1/118* | (2015.01) |
| *G03F 7/00* | (2006.01) |

(52) U.S. Cl.
CPC ......... *G02B 3/0018* (2013.01); *B81C 99/0085* (2013.01); *B82Y 20/00* (2013.01); *B82Y 30/00* (2013.01); *B82Y 40/00* (2013.01); *G02B 1/00* (2013.01); *G02B 1/005* (2013.01); *G02B 1/041* (2013.01); *G02B 1/118* (2013.01); *G02B 1/12* (2013.01); *G02B 3/00* (2013.01); *G02B 3/0006* (2013.01); *G02B 3/0012* (2013.01); *G02B 3/0031* (2013.01); *G03F 7/0002* (2013.01); *G03F 7/0005* (2013.01)

(58) Field of Classification Search
None
See application file for complete search history.

(56) References Cited

U.S. PATENT DOCUMENTS

| | | | |
|---|---|---|---|
| 2007/0091443 A1* | 4/2007 | Lim ..................... | G02B 3/0018 359/619 |
| 2009/0034088 A1* | 2/2009 | Delaney ........... | B29D 11/00365 359/642 |
| 2013/0155522 A1* | 6/2013 | Jeong ..................... | G02B 3/02 359/664 |

FOREIGN PATENT DOCUMENTS

KR    1020090097858    9/2009

OTHER PUBLICATIONS

T.G. Harvey, "Replication Techniques for Micro-optics", SPIE, vol. 3099, year 1997, pp. 75-82.*

* cited by examiner

*Primary Examiner* — Jiong-Ping Lu
(74) *Attorney, Agent, or Firm* — Cantor Colburn LLP

(57) ABSTRACT

Provided is a batch fabrication method of three-dimensional photonic microstructures including a support structure fabricating step, a variable structure fabricating step, a thermal reflow step, and a three-dimensional photonic microstructure forming step. The batch fabrication method of three-dimensional photonic microstructures fabricates three-dimensional photonic microstructures having several shapes depending on a demand of a user through these steps.

7 Claims, 14 Drawing Sheets

•••• before reflow
(numerical analysis)

—— after reflow
(numerical analysis)

— — after reflow
(experiment)

BATCH FABRICATION METHOD OF THREE-DIMENSIONAL PHOTONIC MICROSTRUCTURES

CROSS-REFERENCE TO RELATED APPLICATIONS

This application claims priority under 35 U.S.C. §119 to Korean Patent Application No. 10-2014-0024849, filed on Mar. 3, 2014, in the Korean Intellectual Property Office, the disclosure of which is incorporated herein by reference in its entirety.

TECHNICAL FIELD

The following disclosure relates to a batch fabrication method of three-dimensional photonic microstructures. More particularly, the following disclosure relates to a batch fabrication method of three-dimensional photonic microstructures capable of adjusting shapes of surfaces of fabricated three-dimensional photonic microstructures and replicating the three-dimensional photonic microstructures by adjusting widths, heights, shapes, and positions of support structures and variable structures and annealing the support structures and the variable structures.

BACKGROUND

Generally, three-dimensional photonic microstructures have been variously utilized in an imaging field, a display field, an illumination field, and the like. A micro prism, which is a kind of three-dimensional photonic microstructures, has been used in the imaging field, and an asymmetric micro lens or a micro slant mirror has been used in the display field in order to increase brightness of a reflective liquid crystal display (LCD). The three-dimensional photonic microstructures used in several fields as described above may substitute for a role of an existing photonic device, may implement a function that may not be implemented by the existing photonic device, and may become small and light. Therefore, several studies on a fabrication method of three-dimensional photonic microstructures have been currently conducted, and a fabrication method of three-dimensional photonic microstructures according to the related art has been disclosed in Korean Patent Laid-Open Publication No. 10-2009-0097858 (entitled "Method and Arrangement for Manufacturing Optical Products with Complex Three-Dimensional Forms" and published on Sep. 16, 2009).

As a typical fabrication method of three-dimensional photonic microstructures, there are a gray-scale lithography method, a direct laser writing method, a thermal reflow method, and the like.

As a method of fabricating three-dimensional photonic microstructures using a gray-scale lithography, there are mainly two methods. One is a method of using a high energy beam sensitive glass (HEBS glass), and the other is a method of using a chrome on glass (COG). In the case in which the HEBS glass is used as a mask, an electron beam (E-beam) writer is necessarily required in order to fabricate the mask. However, in the case in which the mask is fabricated using the electron beam writer, a cost required for fabricating the mask is increased. In addition, in the case in which the COG is used as a mask, a cost is low. However, a stepper for performing a projection lithography is required in order to fabricate photonic structures, such that a fabrication process of the photonic structures is complicated. In addition, since the fabricated structures have a step shape, it is not appropriate for being utilized in a high efficiency photonic device.

In the case in which the photonic device is fabricated using the direct laser writing method, it is not appropriate for a batch fabrication process of the photonic structures due to a scanning type.

The thermal reflow method has a disadvantage that shapes of fabricated photonic structures are restrictive.

RELATED ART DOCUMENT

Patent Document

Korean Patent Laid-Open Publication No. 10-2009-0097858 (entitled "Method and Arrangement for Manufacturing Optical Products with Complex Three-Dimensional Forms" and published on Sep. 16, 2009)

SUMMARY

An embodiment of the present invention is directed to providing a batch fabrication method of three-dimensional photonic microstructures capable of forming three-dimensional photonic microstructures having shapes desired by a user by changing one or more of several variables such as widths, heights, shapes, temperatures, positions, and the like, of support structures and variable structures to make deformation levels of the variable structures different from each other even though heat having the same temperature is applied to the variable structures.

Another embodiment of the present invention is directed to providing a batch fabrication method of three-dimensional photonic microstructures capable of forming three-dimensional photonic microstructures having shapes desired by a user by adjusting surface energy of a substrate on which support structures are formed to make deformation levels of variable structures by a thermal reflow step different from each other depending on an adjustment degree of the surface energy.

Still another embodiment of the present invention is directed to providing a batch fabrication method of three-dimensional photonic microstructures capable of easily fabricating the three-dimensional photonic microstructures without requiring a complicated equipment and process by disposing support structures and variable structures on a substrate and annealing the support structures and the variable structures.

Yes still another embodiment of the present invention is directed to providing a batch fabrication method of three-dimensional photonic microstructures capable of easily mass-producing the three-dimensional photonic microstructures through replica molding.

In one general aspect, a batch fabrication method of three-dimensional photonic microstructures includes: a support structure fabricating step (S10) of disposing support structures 200 protruding upwardly from a substrate 100 on the substrate 100; a variable structure fabricating step (S30) of disposing variable structures 300 on the substrate 100, the variable structures 300 being made of a material of which a shape is changed by thermal reflow and being formed so as to partially contact the support structures 200; a thermal reflow step (S40) of applying heat to the substrate; and a three-dimensional photonic microstructure forming step (S50) of forming the three-dimensional photonic microstructures by changing the shapes of the variable structures 300 by the thermal reflow step (S40).

Shapes of the fabricated three-dimensional photonic microstructures may be adjusted by adjusting one or more variable selected among variables including widths, heights, shapes, dispositions, or annealing temperatures of the support structures 200 and the variable structures 300.

Shapes of surfaces of the fabricated three-dimensional photonic microstructures may be adjusted so as to be concave, flat, or convex depending on a height ratio of the variable structures 300 and the support structures 200.

The batch fabrication method of three-dimensional photonic microstructures may further include, after the support structure fabricating step (S10), a surface treating step (S20) of adjusting surface energy of the substrate 100, whereby the shapes of the variable structures 300 of the fabricated three-dimensional photonic microstructures are adjusted depending on an adjustment level of the surface energy.

A support structure base 220 may be formed between the support structures 200 and the substrate 100.

The batch fabrication method of three-dimensional photonic microstructures may further include, after the three-dimensional photonic microstructure forming step (S50), a mold fabricating step (S60) of fabricating a mold 10 of the formed three-dimensional photonic microstructures; a filling step (S70) of filling a filling material 20 in the mold 10 fabricated by the mold fabricating step (S60) to mold the three-dimensional photonic microstructures; a curing step (S80) of curing the filling material 20 by applying ultraviolet or heat to the filling material 20; and a separating step (S90) of separating the three-dimensional photonic microstructures molded by the curing step (S80) from the mold 10.

Shapes of the three-dimensional photonic microstructures may be adjusted by performing an etching process using the three-dimensional photonic microstructures formed by the three-dimensional photonic microstructure forming step (S50) as a mask.

Figure 1:
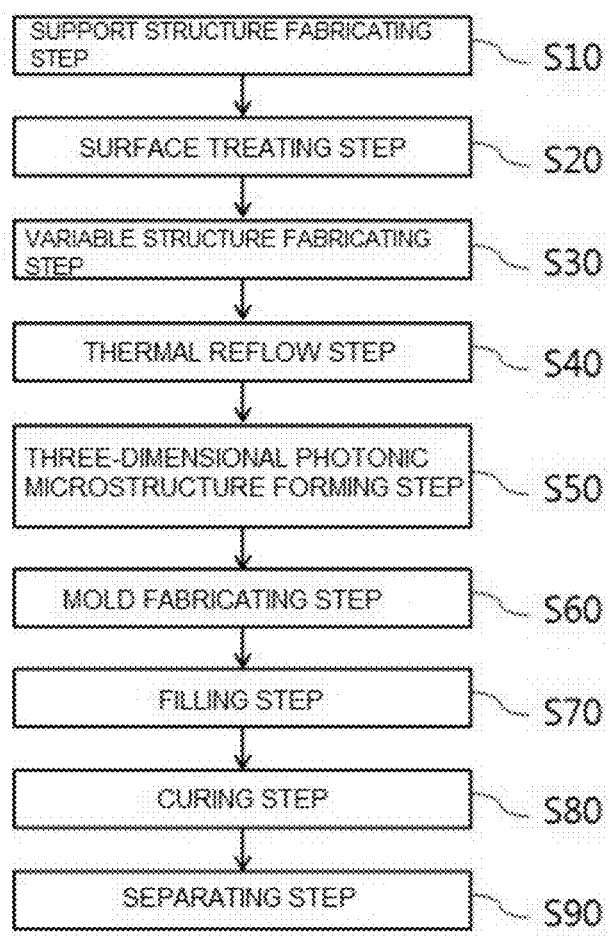
FIG. 1 is a flow chart of a fabrication method of three-dimensional photonic microstructures according to an exemplary embodiment of the present invention.

[Detailed Description of Main Elements]
10: mold
20: filling material
30: substrate
40: metal
100: substrate
200: support structure base
220: support structure
300: variable structure S10~S90: sequences of batch fabrication method of three-dimensional photonic microstructures according to the present invention

DETAILED DESCRIPTION OF EMBODIMENTS

Hereinafter, a technical spirit of the present invention will be described in more detail with reference to the accompanying drawings.

The accompanying drawings are only examples illustrated in order to describe the technical idea of the present invention in more detail. Therefore, the technical idea of the present invention is not limited to forms of the accompanying drawings.

FIG. 1 is a flow chart of a fabrication method of three-dimensional photonic microstructures according to an exemplary embodiment of the present invention, and FIGS. 2 to 8 are schematic views of the fabrication method of three-dimensional photonic microstructures according to the exemplary embodiment of the present invention.

In order to fabricate the three-dimensional photonic microstructures according to the exemplary embodiment of the present invention, a support structure fabricating step (S10) is first performed. In the support structure fabricating step (S10), support structures 200 are formed and disposed on a substrate 100. Here, the support structures 200 protrude upwardly from the substrate 100. Here, a glass transition temperature of a material configuring the formed support structures 200 is called T1.

Figure 2:
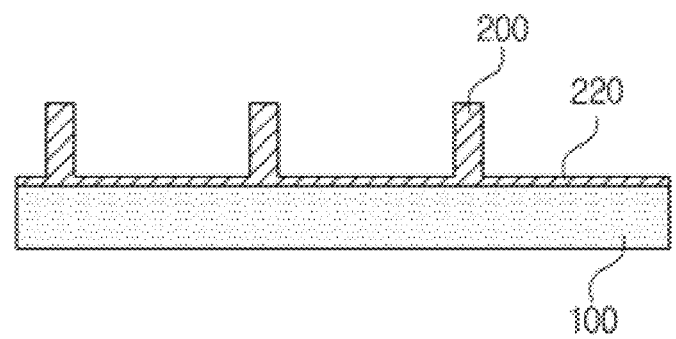
FIGS. 2 to 8 are schematic views of the fabrication method of three-dimensional photonic microstructures according to the exemplary embodiment of the present invention.

As illustrated in FIG. 2, in the fabrication method of three-dimensional photonic microstructures according to the exemplary embodiment of the present invention, a support structure base 220 may be further formed between the support structures 200 and the substrate 100, if necessary. In the case in which adhesion between the support structures 200 and the substrate 100 is decreased, the support structure base 220 may serve as an adhesive between the support structures 200 and the substrate 100 to increase the adhesion. In addition, since a variation in surface energy is generated in the substrate 100 over time, such that a surface feature of the substrate 100 may be varied, the support structure base 220 is disposed on the substrate 100, thereby making it possible to prevent the variation in the surface energy.

Figure 3:
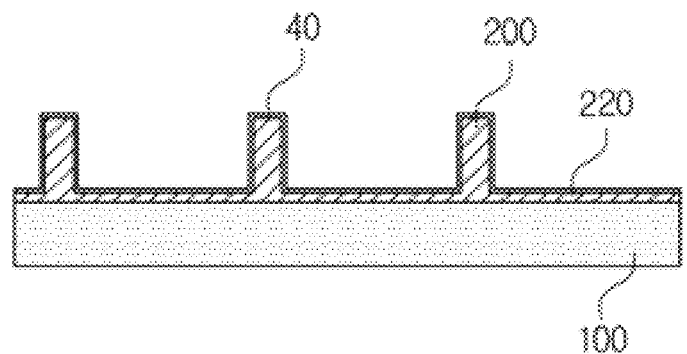

After the support structure fabricating step (S10), a surface treating step (S20) is performed. In the surface treating step (S20), the surface energy of the substrate 100 is adjusted. That is, a property of the substrate 100 is changed. In the surface treating step (S20), plasma processing is performed on surfaces of the support structures 200, chemical processing for applying a chemical material is performed on the surfaces of the support structures 200, or several metals 40 are applied onto the surfaces of the support structures 200 depending on a demand of a user, as illustrated in FIG. 3.

Figure 4:
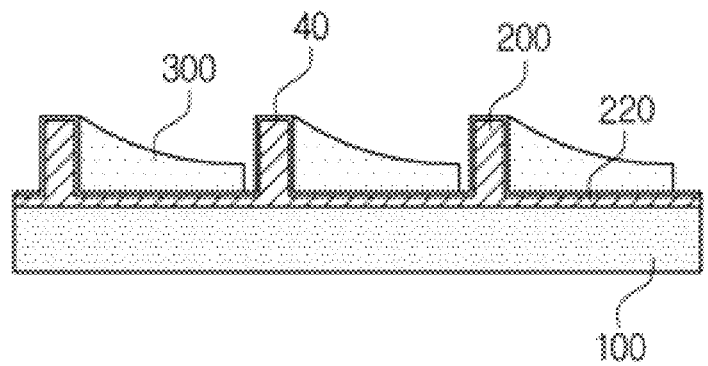

Then, a variable structure fabricating step (S30) is performed. Variable structures 300 are made of materials of which shapes are changed by thermal reflow, are disposed on the substrate 100, as illustrated in FIG. 4, and are formed so as to partially contact the support structures 200. Contact parts of the variable structures 300 are formed so as to be different from each other depending on shapes and sizes of three-dimensional photonic microstructures that are to be fabricated by the user. That is, the variable structures 300 may be formed so that the outermost sides thereof contact wall structures 210 or be formed so that they contact both side surfaces of the wall structures 210. Here, a glass transition temperature of a material configuring the formed variable structures 300 is called T2.

Figure 5:
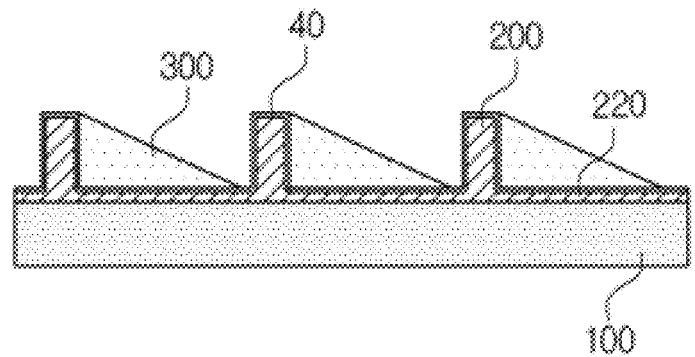

Next, as illustrated in FIG. 5, a thermal reflow step (S40) of applying heat to the substrate in order to change the shapes of the variable structures 300 is performed. When a temperature of heat applied to the substrate in the thermal reflow step (S40) is T3, T3 is higher than the glass transition temperature, that is, T2, of the variable structures 300 and is lower than the glass transition temperature, that is, T1, of the support structures 200. Therefore, the support structures 200 are not deformed, and only the variable structures 300 are deformed by the thermal reflow step (S40), such that predetermined shapes desired by the user may be formed. Here, it is preferable that the substrate is made of glass, silicon, or the like, such that it is not deformed in the thermal reflow step (S40).

Next, a three-dimensional photonic microstructure forming step (S50) is performed. In the three-dimensional photonic microstructure forming step (S50), the shapes of the variable structures 300 are changed as illustrated in FIG. 5 by the thermal reflow step (S40), such that three-dimensional photonic microstructures are formed.

In a batch replication method of three-dimensional photonic microstructures according to the exemplary embodiment of the present invention, the three-dimensional photonic microstructures fabricated by the above-mentioned process may be replica-molded to thereby be mass-produced.

Figure 6:
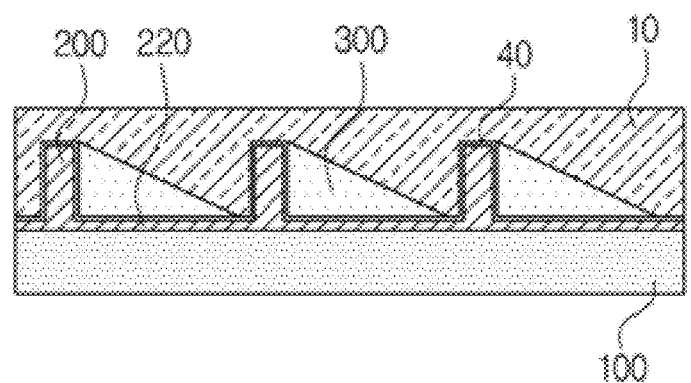

In order to mass-produce the three-dimensional photonic microstructures fabricated by the above-mentioned process, a mold fabricating step (S60) is first performed. In the mold fabricating step (S60), as illustrated in FIG. 6, a mold 10 of the three-dimensional photonic microstructures fabricated by the above-mentioned process is fabricated. The mold 10 may be made of a material that is generally used at the time of fabricating a mold, such as a metal 40, a polymer, polydimethylsiloxane, or the like, such that it may be easily purchased at the time of being fabricated.

Figure 7:
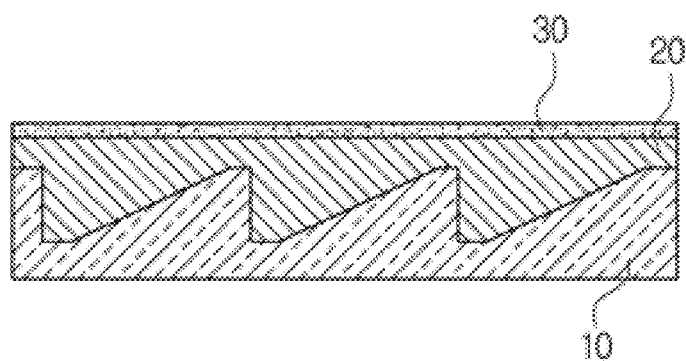

Then, a filling step (S70) is performed. In the filling step (S70), as illustrated in FIG. 7, a filling material 20 is filled in the mold 10 fabricated by the mold fabricating step (S60) to mold the three-dimensional photonic microstructures. After the filling material 20 is filled, an upper side of the filling material 20 is covered with a substrate 30, such that they are formed in one structure. Here, it is preferable that a material that is generally used, such as an ultraviolet curable polymer, a thermosetting polymer, a ceramic, or the like, is used as the filling material 20.

Next, a curing step (S80) is performed. In the curing step (S80), ultraviolet or heat is applied to the filling material 20 to cure the filling material 20.

Figure 8:
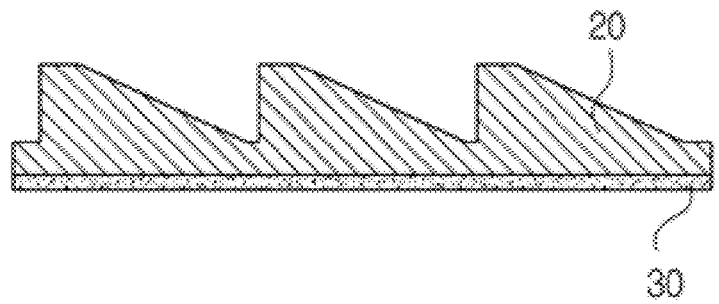

Next, as illustrated in FIG. 8, a separating step (S90) is performed. In the separating step (S90), the three-dimensional photonic microstructures molded through the above-mentioned process are separated from the mold 10.

In the fabrication method of three-dimensional photonic microstructures according to the exemplary embodiment of the present invention, several variables are adjusted, thereby making it possible fabricate photonic microstructures having shapes desired by the user. The variables include widths, heights, shapes, temperatures, positions, and the like, of the support structures 200 and the variable structures 300, and any one or one or more selected among the above-mentioned variables may be adjusted to fabricate the three-dimensional photonic microstructures.

Figure 9:
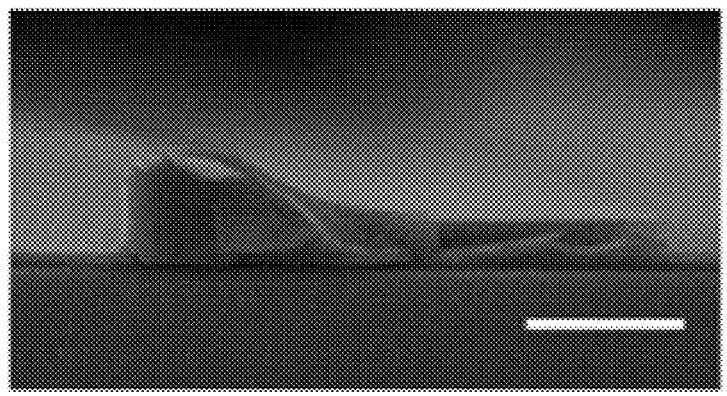
FIGS. 9 to 17 are views illustrating examples of three-dimensional photonic microstructures formed depending on a height ratio between support structures and variable structures according to the exemplary embodiment of the present invention.
Figure 10:
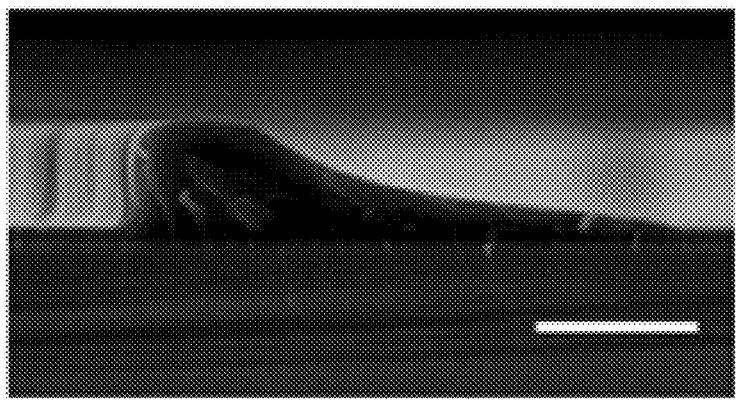
Figure 11:
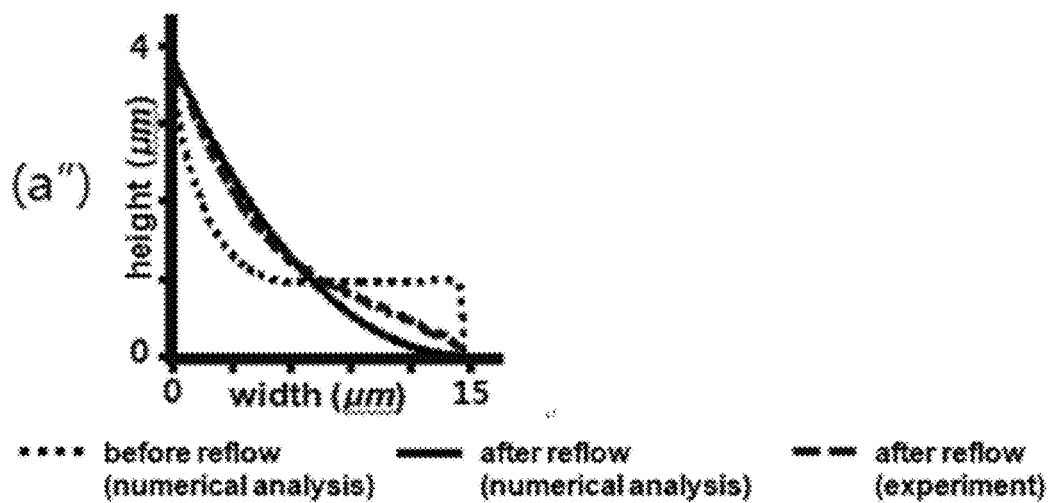
Figure 12:
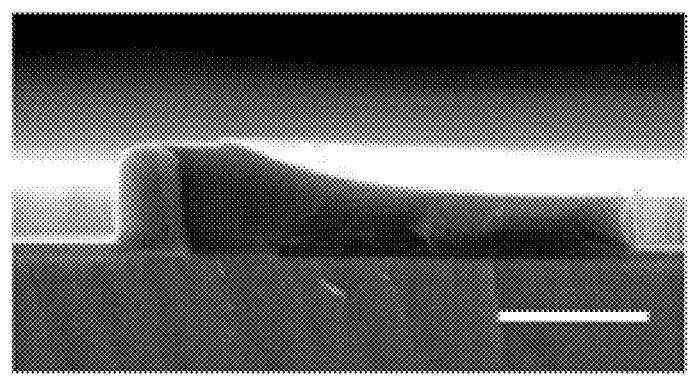
Figure 13:
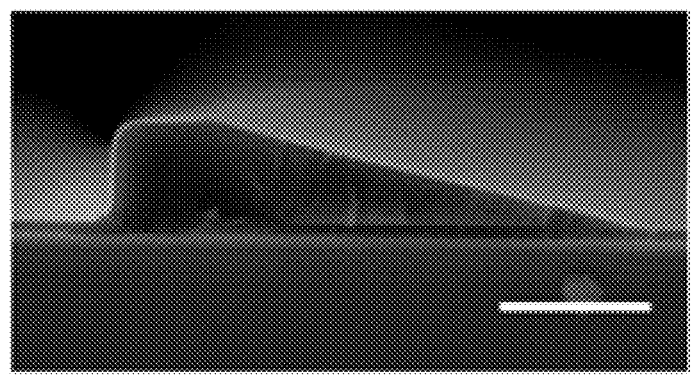
Figure 14:
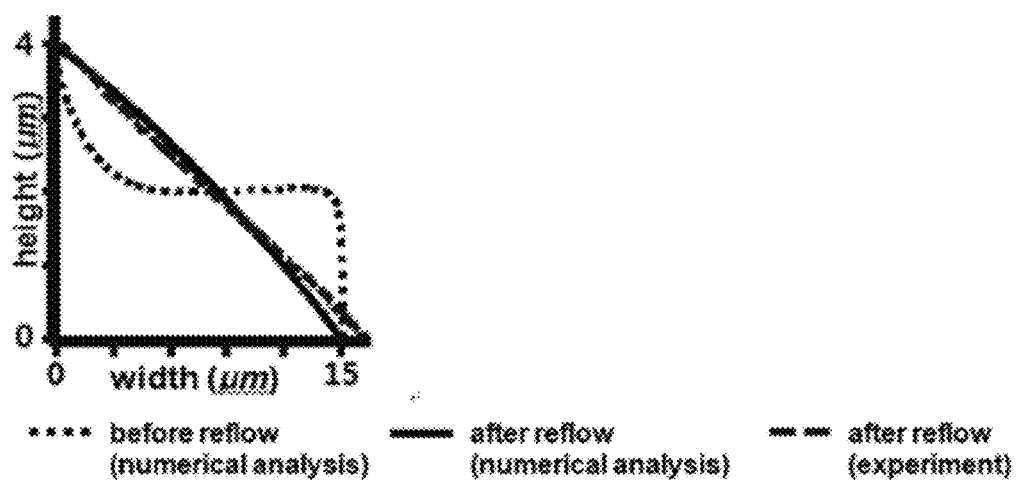
Figure 15:
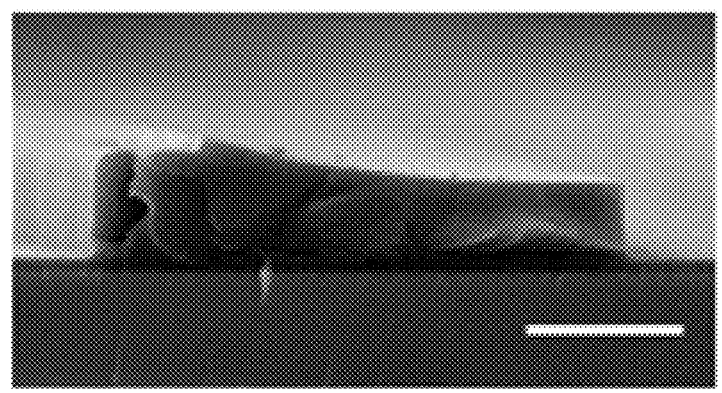
Figure 16:
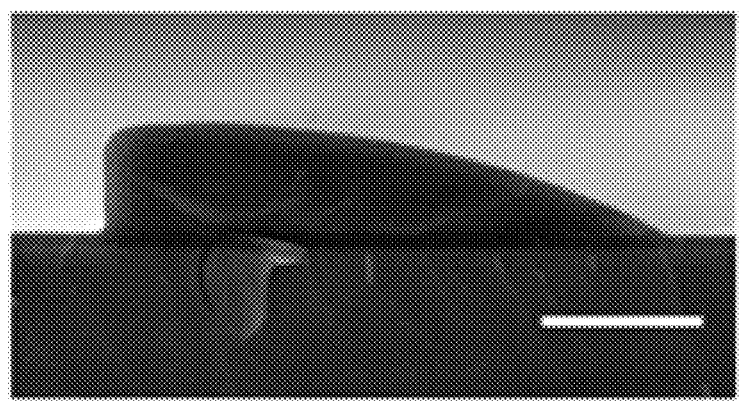
Figure 17:
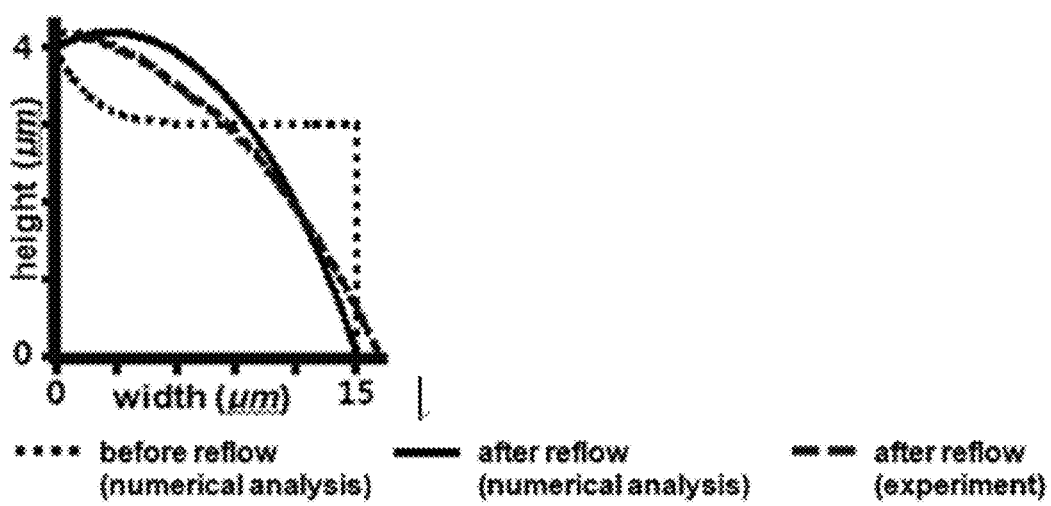

FIGS. 9 to 17 illustrate experiment results of cross-sectional shapes of three-dimensional photonic microstructures fabricated depending on each height while changing a height of the variable structures 300 to 1 μm, 2 μm, and 3 μm in the case in which a height of the support structures 200 according to the exemplary embodiment of the present disclosure is 4 μm and a width of the variable structures 300 according to the exemplary embodiment of the present disclosure is 15 μm. In more detail, FIGS. 9, 12, 15 illustrate cross-sectional shapes of the support structures 200 and the variable structures 300 before thermal reflow, FIGS. 10, 13, 16 illustrate cross-sectional shapes of the support structures 200 and the variable structures 300 after the thermal reflow, and FIGS. 11, 14, 17 illustrate the cross-sectional shapes of the support structures 200 and the variable structures 300 of FIGS. 9, 12, 15 and the cross-sectional shapes of the support structures 200 and the variable structures 300 of FIGS. 10, 13, 16.

FIGS. 11, 14, 17 will be described in more detail. In FIGS. 11, 14, 17, a dotted line in which lengths of each point are short indicates numerical analysis values of the support structures 200 and the variable structures 300 before the thermal reflow, a solid line indicates numerical analysis values of the support structures 200 and the variable structures 300 after the thermal reflow, and a dotted line in which lengths of each point are long indicates indicate experiment values of the support structures 200 and the variable structures 300 after the thermal reflow.

It may be appreciated from each result after the thermal reflow of FIGS. 9 to 17 that surfaces of fabricated three-dimensional photonic microstructures have a concave shape in the case in which a height of the variable structures 300 is lower than an average as a shape of a surface of the variable structures 300 after the thermal reflow, has a flat shape in the case in which the height of the variable structures 300 is the average, and has a convex shape in the case in which the height of the variable structures 300 is higher than the average. Therefore, in the batch fabrication method of three-dimensional photonic microstructures according to the exemplary embodiment of the present invention, the shapes of the surfaces of the fabricated three-dimensional photonic microstructures may be adjusted to the shapes desired by the user by simply adjusting the heights of the support structures 200 and the variable structures 300.

FIGS. 18 to 24 illustrate variations in angles formed by fabricated three-dimensional photonic microstructures and a substrate depending on a variation in heights or widths of the variable structures 300 according to the exemplary embodiment of the present invention.

Figure 18:
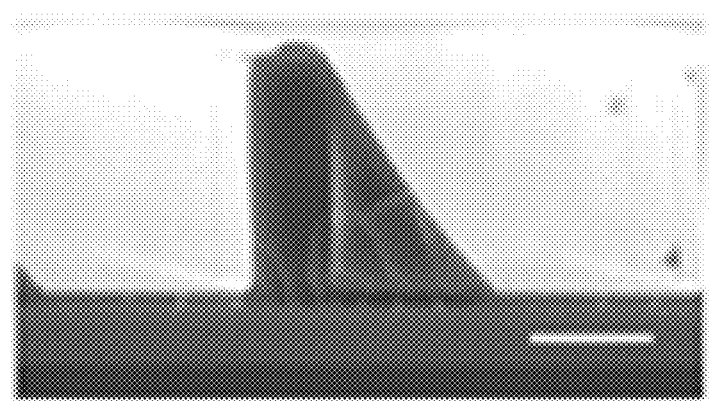
FIGS. 18 to 24 are views illustrating examples of variations in angles formed by fabricated three-dimensional photonic microstructures and a substrate depending on a variation in heights or widths of the variable structures according to the exemplary embodiment of the present invention.
Figure 19:
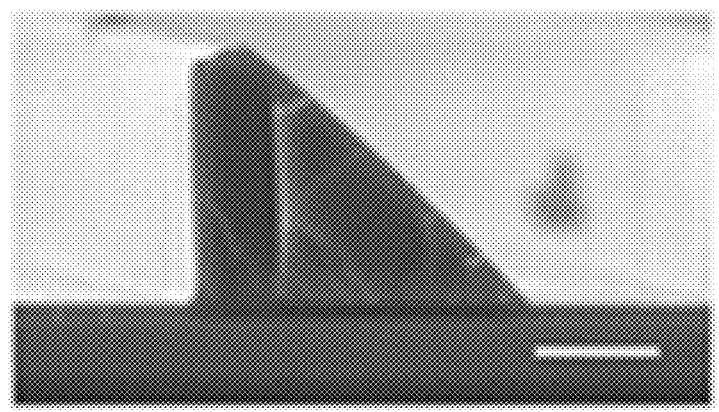
Figure 20:
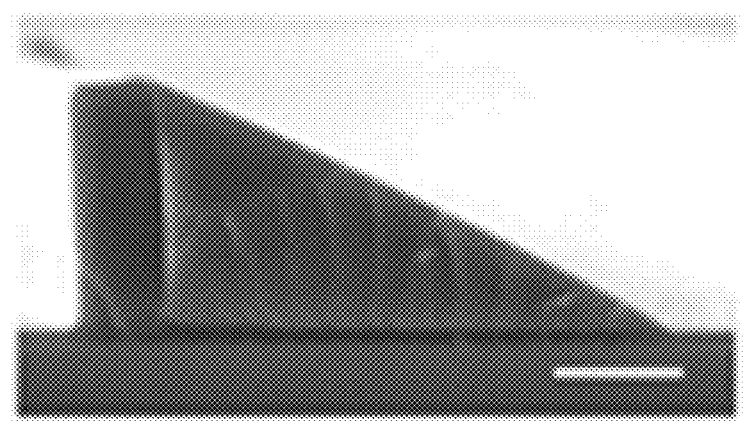

FIGS. 18 to 20 illustrate examples of three-dimensional photonic microstructures fabricated depending on a variation in a width of the variable structures 300 in the case in which heights of the support structures 200 and the variable structures 300 are constant.

Figure 21:
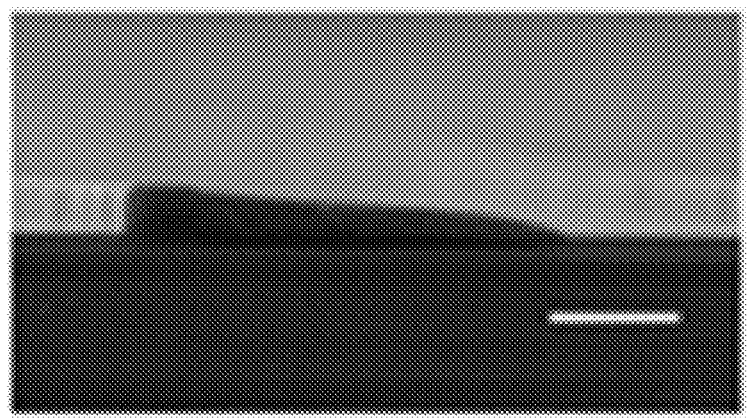
Figure 22:
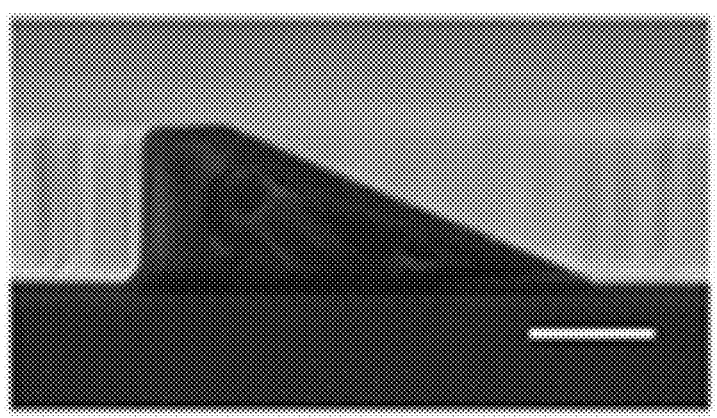
Figure 23:
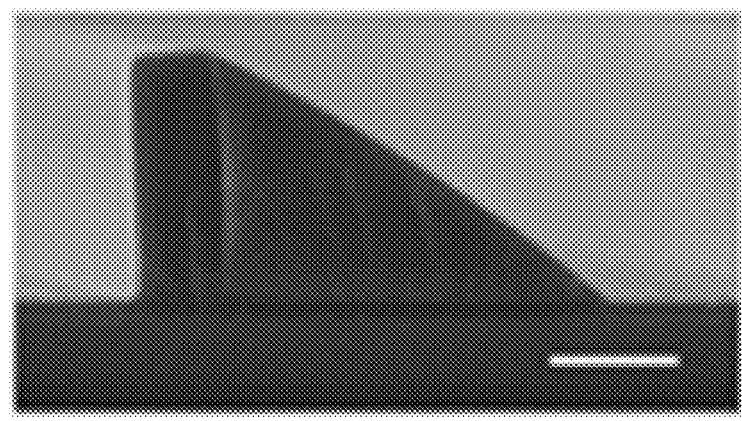

FIGS. 21 to 23 illustrate examples of three-dimensional photonic microstructures fabricated depending on a variation in a height of the variable structures 300 in the case in which widths of the support structures 200 and the variable structures 300 are constant.

Figure 24:
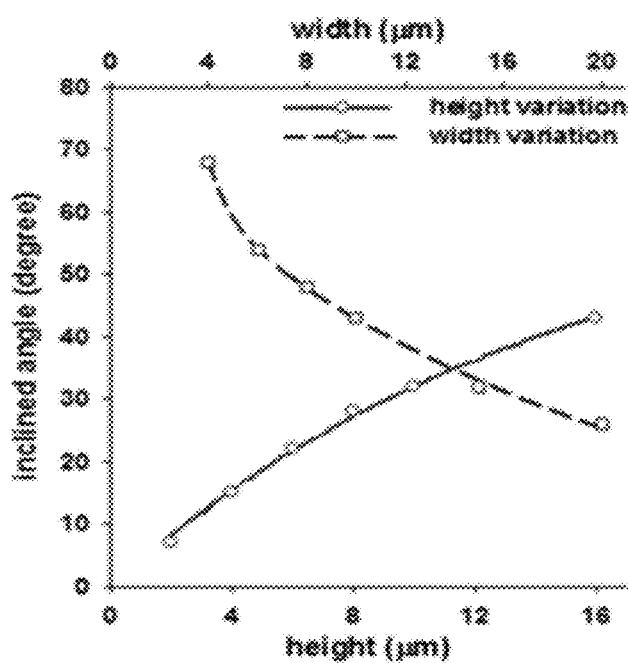

FIG. 24 illustrates angles formed by the three-dimensional photonic microstructures fabricated as described above and the substrate as graphs. In more detail, FIG. 24 illustrates a variation in an angle depending on a variation in a width in the case in which the heights of the support structures 200 and the variable structures 300 are constant as a dotted line, and illustrates a variation in an angle depending on a variation in a height in the case in which the widths of the support structures 200 and the variable structures 300 are constant as a solid line.

As illustrated in FIGS. 18 to 24, it may be appreciated that in the case in which the heights of the support structures 200 and the variable structures 300 are constant, the narrower the width of the variable structures 300, the larger the angle formed by the fabricated three-dimensional photonic microstructures and the substrate 100, and in the case in which the widths of the support structures 200 and the variable structures 300 are constant, the higher the heights of the support structures 200 and the variable structures 300, the larger the angle formed by the fabricated three-dimensional photonic microstructures and the substrate 100. Therefore, the heights and the widths of the support structures 200 and the variable structures 300 are adjusted, thereby making it possible to adjust the angles of the fabricated three-dimensional photonic microstructures to the shapes desired by the user.

Therefore, in the batch fabrication method of three-dimensional photonic microstructures according to the exemplary embodiment of the present invention, the shapes of the surfaces and the angles of the fabricated three-dimensional photonic microstructures may be easily adjusted to the shapes desired by the user by only adjusting the heights and the widths of the support structures 200 and the variable structures 300.

In addition, referring to FIGS. 2 to 17, in the batch fabrication method of three-dimensional photonic microstructures according to the exemplary embodiment of the present invention, a shape of a surface of the variable structures 300 may also be adjusted so as to be concave, flat, or convex depending on a volume of the variable structures 300 occupying a volume of a space formed between adjacent support structures 200.

In detail, when a variable structures 300 having a volume smaller than a volume of a space formed by connecting upper end portions of adjacent support structures 200 to each other is injected into the space formed by connecting the upper end portions of the support structures 200 to each other, the variable structures 300 has a flat shape if a ratio of the volume of the variable structures 300 occupying the volume of the space formed by connecting the upper end portions of the support structures 200 to each other is adjacent to about 50% by surface tension of the variable structures 300 after the thermal reflow, has a convex curved shape in which it protrudes upwardly if the ratio exceeds 50% by the surface tension of the variable structures 300 after the thermal reflow, and has a concave curved shape in which it protrudes downwardly if the ratio is less than 50% by the surface tension of the variable structures 300 after the thermal reflow.

Meanwhile, in the batch fabrication method of three-dimensional photonic microstructures according to the exemplary embodiment of the present invention, although not illustrated in the accompanying drawings, the shapes of the fabricated three-dimensional photonic microstructures may be adjusted through an etching process. The etching process is configured so that the shapes of the three-dimensional photonic microstructures transferred to the substrate 100 are adjusted by changing materials configuring the three-dimensional photonic microstructures into materials configuring the substrate 100 and adjusting a ratio in which the fabricated three-dimensional photonic microstructures and the substrate 100 are etched in the etching process.

Figure 25:
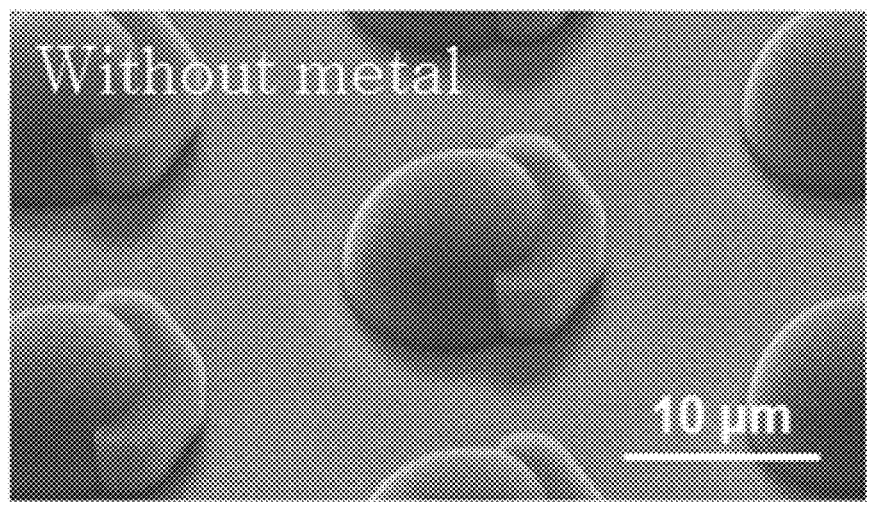
FIGS. 25 to 27 are views illustrating examples of three-dimensional photonic microstructures formed by a surface treating step according to the exemplary embodiment of the present invention.
Figure 26:
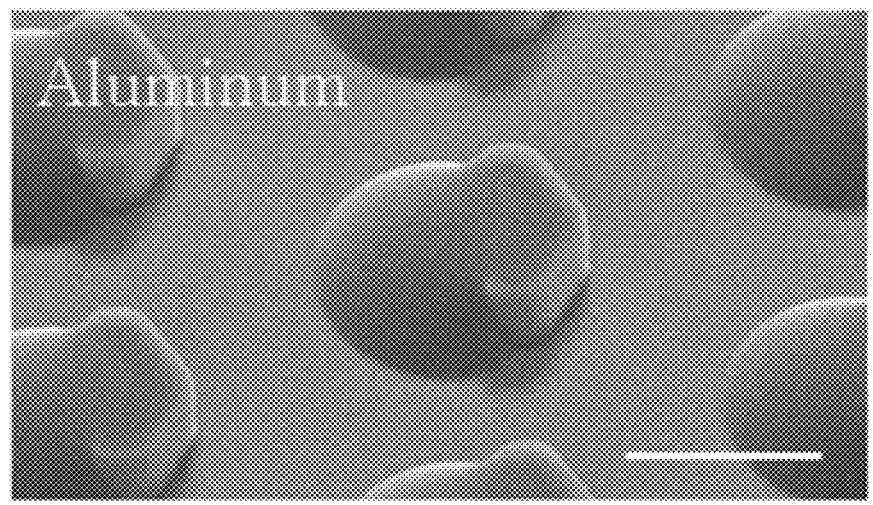
Figure 27:
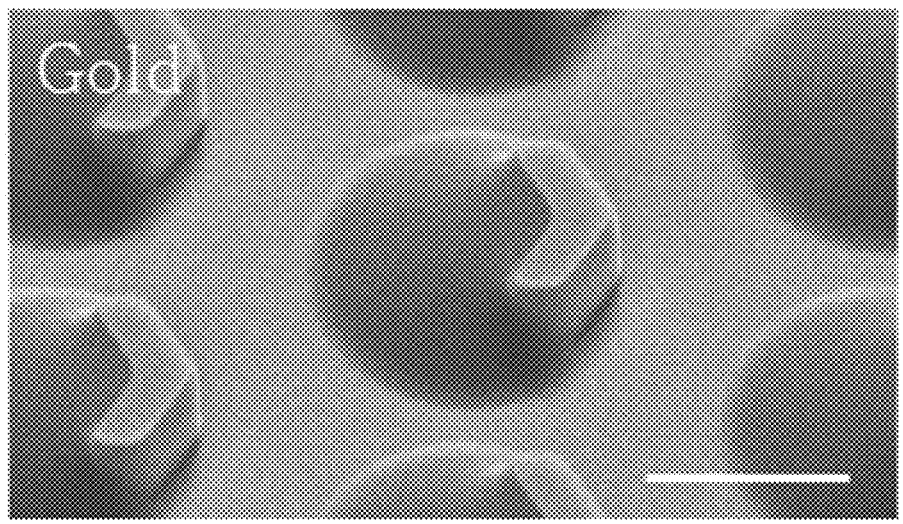

FIGS. 25 to 27 are views illustrating examples of three-dimensional photonic microstructures formed by a surface treating step (S20) according to the exemplary embodiment of the present invention.

In the three-dimensional photonic microstructures according to the exemplary embodiment of the present invention, an appropriate metal 40 is applied and annealed depending on a demand of the user in the surface treating step (S20), thereby making it possible to adjust the shapes of the fabricated three-dimensional photonic microstructures.

FIG. 25 illustrates shapes of three-dimensional photonic microstructures formed in the case in which the metal 40 is not applied, FIG. 26 illustrates shapes of three-dimensional photonic microstructures formed in the case in which aluminum is applied, and FIG. 27 illustrates shapes of three-dimensional photonic microstructures formed in the case in which gold is applied. As described above, in the batch fabrication method of three-dimensional photonic microstructures according to the exemplary embodiment of the present invention, the metal 40 for forming the shapes desired by the user is applied to the support structures 200, thereby making it possible to fabricate the three-dimensional photonic microstructures having various shapes.

Figure 28:
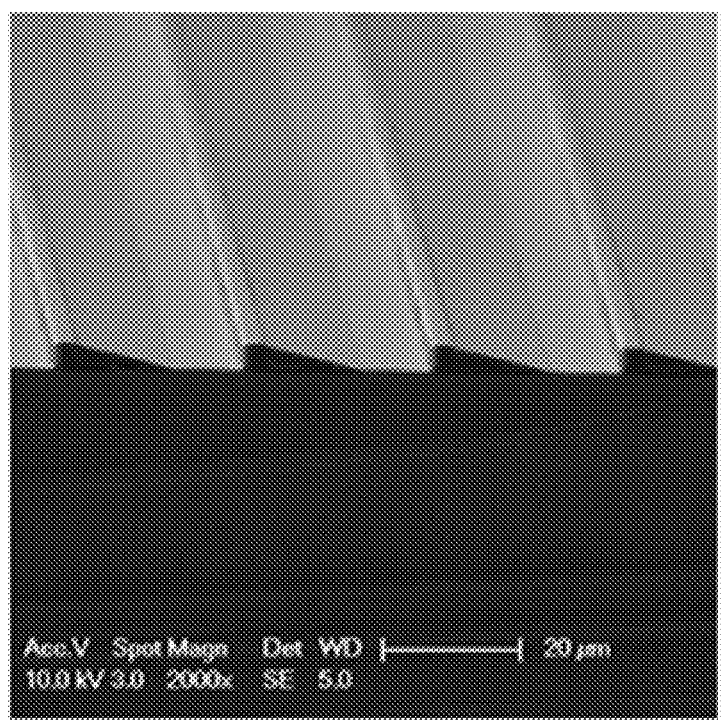
FIGS. 28 to 30 are views illustrating several examples of three-dimensional photonic microstructures formed according to the exemplary embodiment of the present invention.
Figure 29:
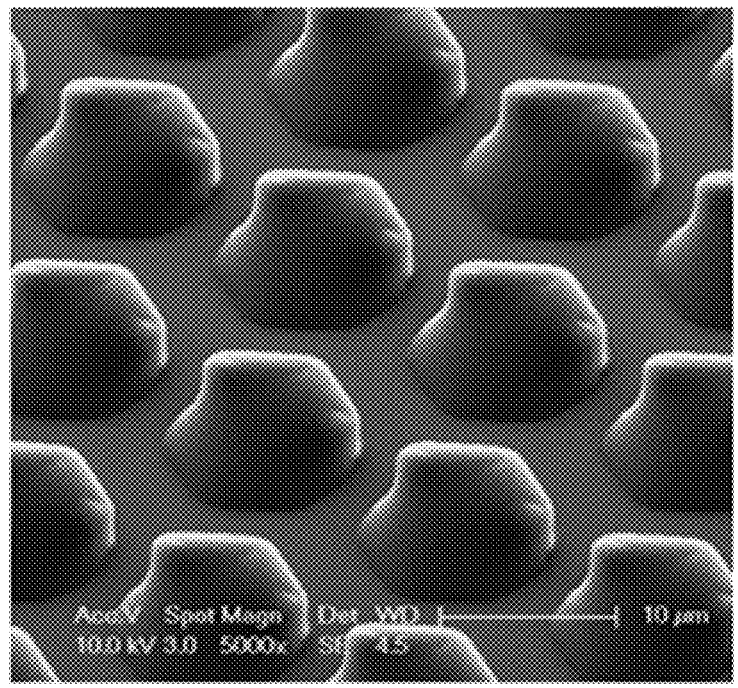
Figure 30:
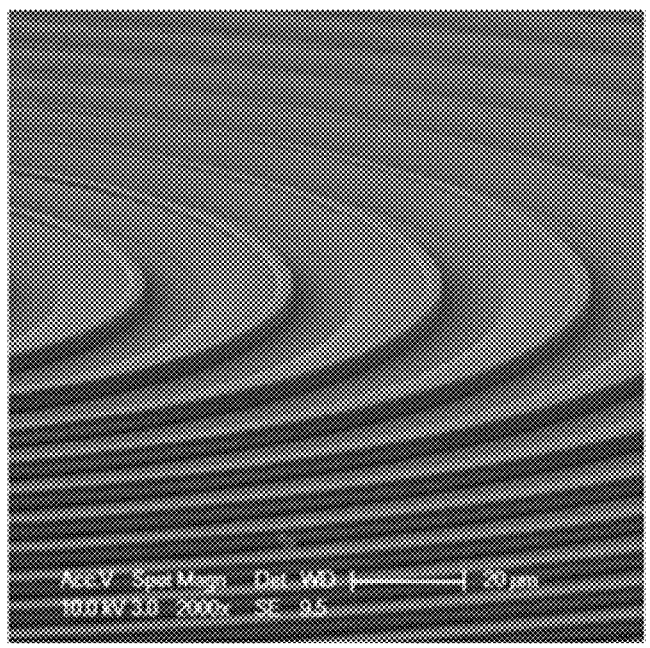

FIGS. 28 to 30 are views illustrating examples of three-dimensional photonic microstructures that may be fabricated according to the exemplary embodiment of the present invention.

According to the related art, a high cost was required for fabricating the three-dimensional photonic microstructures or a process of fabricating the three-dimensional photonic microstructures was complicated, such that there were several problems in fabricating the three-dimensional photonic microstructures. However, in the fabrication method of three-dimensional photonic microstructures according to the exemplary embodiment of the present invention, as illustrated in FIGS. 28 to 30, a pair of support structures 200 and variable structures 300 having shapes desired by the user are disposed, and widths, heights, and the like, of the support structures 200 and the variable structures 300 are adjusted, thereby making it possible to fabricate the three-dimensional photonic microstructures without performing a complicated process. In addition, in the fabrication method of three-dimensional photonic microstructures according to the exemplary embodiment of the present invention, since the three-dimensional photonic microstructures are fabricated using a material that is generally used, the material for fabricating the three-dimensional photonic microstructures may be easily purchased.

In the batch fabrication method of three-dimensional photonic microstructures according to the exemplary embodiment of the present invention, one or more of several variables such as the heights, the widths, the shapes, the temperatures, the positions, and the like, of the support structures and the variable structures are changed, thereby making it possible to fabricate the photonic microstructures having the shapes desired by the user. Therefore, a configuration is simple, such that the photonic microstructures may be easily fabricated and economic efficiency may be high, and three-dimensional photonic microstructures having several shapes that are not limited may be fabricated.

The present invention is not limited to the above-mentioned exemplary embodiments, and may be variously applied, and may be variously modified without departing from the gist of the present invention claimed in the claims.

What is claimed is:

1. A batch fabrication method of three-dimensional photonic microstructures, the method comprising:
   a support structure fabricating step of disposing support structures protruding upwardly from a surface of a substrate;
   a variable structure fabricating step of disposing variable structures on the surface of the substrate between neighboring support structures, each of the variable structures, one side of which contacts one of the neighboring support structures and the other side of which does not contact the other one of the neighboring support structures, the variable structures being made of a material of which shape is changed by thermal energy;
   a thermal reflow step of applying heat to the substrate; and
   a three-dimensional photonic microstructure forming step of forming three-dimensional photonic microstructures by changing shapes of the variable structures by the thermal reflow step.

2. The batch fabrication method of three-dimensional photonic microstructures of claim 1, wherein shapes of the fabricated three-dimensional photonic microstructures are adjusted by adjusting one or more selected among variables including widths, heights, shapes, dispositions, and annealing temperatures of the support structures and the variable structures.

3. The batch fabrication method of three-dimensional photonic microstructures of claim 2, wherein shapes of surfaces of the fabricated three-dimensional photonic microstructures are adjusted so as to be concave, flat, or convex depending on a height ratio of the variable structures and the support structures.

4. The batch fabrication method of three-dimensional photonic microstructures of claim 1, further comprising, after the support structure fabricating step, a surface treating step of adjusting surface energy of the substrate, whereby the shapes of the variable structures of the fabricated three-dimensional photonic microstructures are adjusted depending on an adjustment level of the surface energy.

5. The batch fabrication method of three-dimensional photonic microstructures of claim 1, wherein a support structure base is disposed on the substrate in such a manner as to connect bottoms of the support structures to the support structure base.

6. The batch fabrication method of three-dimensional photonic microstructures of claim 1, further comprising, after the three-dimensional photonic microstructure forming step,
   a mold fabricating step of fabricating a mold of the formed three-dimensional photonic micro structures;
   a filling step of filling a filling material in the mold fabricated by the mold fabricating step to mold the three-dimensional photonic microstructures;
   a curing step of curing the filling material by applying ultraviolet or heat to the filling material; and
   a separating step of separating the three-dimensional photonic microstructures molded by the curing step from the mold.

7. The batch fabrication method of three-dimensional photonic microstructures of claim 1, wherein shapes of the three-dimensional photonic microstructures are adjusted by performing an etching process using the three-dimensional photonic microstructures as a mask.

* * * * *